US006914547B1

(12) United States Patent
Swaroop et al.

(10) Patent No.: US 6,914,547 B1
(45) Date of Patent: Jul. 5, 2005

(54) TRIPLE RESISTOR STRING DAC ARCHITECTURE

(75) Inventors: Prem S Swaroop, Bangalore (IN); Arindam Raychaudhuri, Bangalore (IN); Kaushal Kumar Jha, Bangalore (IN)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 10/838,806

(22) Filed: May 4, 2004

(51) Int. Cl.[7] .......................... H03M 1/66; H03M 1/78
(52) U.S. Cl. ...................................... 341/144; 341/154
(58) Field of Search .............................. 341/144, 154, 341/145, 159

(56) References Cited

U.S. PATENT DOCUMENTS

| 5,495,245 | A | * | 2/1996 | Ashe | 341/145 |
| 5,703,588 | A | * | 12/1997 | Rivoir et al. | 341/159 |
| 5,831,566 | A | * | 11/1998 | Ginetti | 341/144 |
| 5,838,273 | A | * | 11/1998 | Sauerbrey et al. | 341/145 |
| 5,969,657 | A | | 10/1999 | Dempsey et al. | 341/145 |
| 5,977,898 | A | * | 11/1999 | Ling et al. | 341/144 |
| 5,999,115 | A | * | 12/1999 | Connell et al. | 341/145 |
| 6,201,491 | B1 | * | 3/2001 | Brunolli et al. | 341/144 |
| 6,384,763 | B1 | * | 5/2002 | Leung et al. | 341/154 |
| 6,567,026 | B1 | * | 5/2003 | Gorman | 341/154 |
| 6,621,440 | B2 | * | 9/2003 | Gorman | 341/154 |
| 6,778,122 | B2 | * | 8/2004 | Lien | 341/154 |
| 6,781,536 | B1 | * | 8/2004 | Martins | 341/144 |

* cited by examiner

Primary Examiner—Jean Bruner Jeanglaude
(74) Attorney, Agent, or Firm—Global IP Services PLLC; Prakash Nama

(57) ABSTRACT

A technique to provide a higher resolution DAC architecture for converting an N-bit digital word to a corresponding analog voltage signal without increasing chip area and switching capacitance. In one example embodiment, this is accomplished by using a triple string converter. In the triple string converter, a triple switching tree is coupled to a triple resistor string and to an analog output. Each switching tree includes a plurality of switches and each resistor string includes a plurality of corresponding resistors. A logic decoder coupled to the triple switching tree receives an N-bit digital word and generates a digital signal. The plurality of switches in each switching tree is substantially simultaneously controlled by the digital signal to output a range of corresponding analog voltage signals when the triple resistor string is connected across a voltage supply.

22 Claims, 3 Drawing Sheets

| DIGITAL CODE | | | | | | CLOSED SWITCHES | OPEN SWITCHES | OUTPUT VOLTAGE |
|---|---|---|---|---|---|---|---|---|
| N6 | N5 | N4 | N3 | N2 | N1 | | | |
| 0 | 0 | 0 | 0 | 0 | 0 | SM0 SM1 SP0 SP1 SK0 | SM2 SM3 SM4 SP2 SP3 SP4 SK1 SK2 SK3 | 0 |
| 0 | 0 | 0 | 0 | 0 | 1 | SM0 SM1 SP0 SP1 SK1 | SM2 SM3 SM4 SP2 SP3 SP4 SK0 SK2 SK3 | VREF/64 |
| 0 | 0 | 0 | 0 | 1 | 0 | SM0 SM1 SP0 SP1 SK2 | SM2 SM3 SM4 SP2 SP3 SP4 SK0 SK1 SK3 | 2(VREF/64) |
| 0 | 0 | 0 | 0 | 1 | 1 | SM0 SM1 SP0 SP1 SK3 | SM2 SM3 SM4 SP2 SP3 SP4 SK0 SK1 SK2 | 3(VREF/64) |
| 0 | 0 | 0 | 1 | 0 | 0 | SM0 SM1 SP1 SP2 SK3 | SM2 SM3 SM4 SP0 SP3 SP4 SK0 SK1 SK2 | 4(VREF/64) |
| 0 | 0 | 0 | 1 | 0 | 1 | SM0 SM1 SP1 SP2 SK2 | SM2 SM3 SM4 SP0 SP3 SP4 SK0 SK1 SK3 | 5(VREF/64) |
| 0 | 0 | 0 | 1 | 1 | 0 | SM0 SM1 SP1 SP2 SK1 | SM2 SM3 SM4 SP0 SP3 SP4 SK0 SK2 SK3 | 6(VREF/64) |
| 0 | 0 | 0 | 1 | 1 | 1 | SM0 SM1 SP1 SP2 SK0 | SM2 SM3 SM4 SP0 SP3 SP4 SK2 SK3 SK4 | 7(VREF/64) |
| 0 | 0 | 1 | 0 | 0 | 0 | SM0 SM1 SP2 SP3 SK0 | SM2 SM3 SM4 SP0 SP1 SP4 SK1 SK2 SK3 | 8(VREF/64) |
| 0 | 0 | 1 | 0 | 0 | 1 | SM0 SM1 SP2 SP3 SK1 | SM2 SM3 SM4 SP0 SP1 SP4 SK0 SK2 SK3 | 9(VREF/64) |
| 0 | 0 | 1 | 0 | 1 | 0 | SM0 SM1 SP2 SP3 SK2 | SM2 SM3 SM4 SP0 SP1 SP4 SK0 SK1 SK3 | 10(VREF/64) |
| 0 | 0 | 1 | 0 | 1 | 1 | SM0 SM1 SP2 SP3 SK3 | SM2 SM3 SM4 SP0 SP1 SP4 SK0 SK1 SK2 | 11(VREF/64) |
| 0 | 0 | 1 | 1 | 0 | 0 | SM0 SM1 SP3 SP4 SK3 | SM2 SM3 SM4 SP0 SP1 SP2 SK0 SK1 SK2 | 12(VREF/64) |
| 0 | 0 | 1 | 1 | 0 | 1 | SM0 SM1 SP3 SP4 SK2 | SM2 SM3 SM4 SP0 SP1 SP2 SK0 SK1 SK3 | 13(VREF/64) |
| 0 | 0 | 1 | 1 | 1 | 0 | SM0 SM1 SP3 SP4 SK1 | SM2 SM3 SM4 SP0 SP1 SP2 SK0 SK2 SK3 | 14(VREF/64) |
| 0 | 0 | 1 | 1 | 1 | 1 | SM0 SM1 SP3 SP4 SK0 | SM2 SM3 SM4 SP0 SP1 SP2 SK1 SK2 SK3 | 15(VREF/64) |
| 0 | 1 | 0 | 0 | 0 | 0 | SM1 SM2 SP3 SP4 SK0 | SM0 SM3 SM4 SP0 SP1 SP2 SK1 SK2 SK3 | 16(VREF/64) |
| 0 | 1 | 0 | 0 | 0 | 1 | SM1 SM2 SP3 SP4 SK1 | SM0 SM3 SM4 SP0 SP1 SP2 SK0 SK2 SK3 | 17(VREF/64) |
| 0 | 1 | 0 | 0 | 1 | 0 | SM1 SM2 SP3 SP4 SK2 | SM0 SM3 SM4 SP0 SP1 SP2 SK0 SK1 SK3 | 18(VREF/64) |
| 0 | 1 | 0 | 0 | 1 | 1 | SM1 SM2 SP3 SP4 SK3 | SM0 SM3 SM4 SP0 SP1 SP2 SK0 SK1 SK2 | 19(VREF/64) |
| 0 | 1 | 0 | 1 | 0 | 0 | SM1 SM2 SP2 SP3 SK3 | SM0 SM3 SM4 SP0 SP1 SP4 SK0 SK1 SK2 | 20(VREF/64) |
| 0 | 1 | 0 | 1 | 0 | 1 | SM1 SM2 SP2 SP3 SK2 | SM0 SM3 SM4 SP0 SP1 SP4 SK0 SK1 SK3 | 21(VREF/64) |
| 0 | 1 | 0 | 1 | 1 | 0 | SM1 SM2 SP2 SP3 SK1 | SM0 SM3 SM4 SP0 SP1 SP4 SK0 SK2 SK3 | 22(VREF/64) |
| 0 | 1 | 0 | 1 | 1 | 1 | SM1 SM2 SP2 SP3 SK0 | SM0 SM3 SM4 SP0 SP1 SP4 SK2 SK3 SK4 | 23(VREF/64) |
| 0 | 1 | 1 | 0 | 0 | 0 | SM1 SM2 SP1 SP2 SK0 | SM0 SM3 SM4 SP0 SP3 SP4 SK1 SK2 SK3 | 24(VREF/64) |
| 0 | 1 | 1 | 0 | 0 | 1 | SM1 SM2 SP1 SP2 SK1 | SM0 SM3 SM4 SP0 SP3 SP4 SK0 SK2 SK3 | 25(VREF/64) |
| 0 | 1 | 1 | 0 | 1 | 0 | SM1 SM2 SP1 SP2 SK2 | SM0 SM3 SM4 SP0 SP3 SP4 SK0 SK1 SK3 | 26(VREF/64) |
| 0 | 1 | 1 | 0 | 1 | 1 | SM1 SM2 SP1 SP2 SK3 | SM0 SM3 SM4 SP0 SP3 SP4 SK0 SK1 SK2 | 27(VREF/64) |
| 0 | 1 | 1 | 1 | 0 | 0 | SM1 SM2 SP0 SP1 SK3 | SM0 SM3 SM4 SP2 SP3 SP4 SK0 SK1 SK2 | 28(VREF/64) |
| 0 | 1 | 1 | 1 | 0 | 1 | SM1 SM2 SP0 SP1 SK2 | SM0 SM3 SM4 SP2 SP3 SP4 SK0 SK1 SK3 | 29(VREF/64) |
| 0 | 1 | 1 | 1 | 1 | 0 | SM1 SM2 SP0 SP1 SK1 | SM0 SM3 SM4 SP2 SP3 SP4 SK0 SK2 SK3 | 30(VREF/64) |
| 0 | 1 | 1 | 1 | 1 | 1 | SM1 SM2 SP0 SP1 SK0 | SM0 SM3 SM4 SP2 SP3 SP4 SK1 SK2 SK3 | 31(VREF/64) |
| 1 | 0 | 0 | 0 | 0 | 0 | SM2 SM3 SP0 SP1 SK0 | SM0 SM1 SM4 SP2 SP3 SP4 SK1 SK2 SK3 | 32(VREF/64) |
| 1 | 0 | 0 | 0 | 0 | 1 | SM2 SM3 SP0 SP1 SK1 | SM0 SM1 SM4 SP2 SP3 SP4 SK0 SK2 SK3 | 33(VREF/64) |
| 1 | 0 | 0 | 0 | 1 | 0 | SM2 SM3 SP0 SP1 SK2 | SM0 SM1 SM4 SP2 SP3 SP4 SK0 SK1 SK3 | 34(VREF/64) |
| 1 | 0 | 0 | 0 | 1 | 1 | SM2 SM3 SP0 SP1 SK3 | SM0 SM1 SM4 SP2 SP3 SP4 SK0 SK1 SK2 | 35(VREF/64) |
| 1 | 0 | 0 | 1 | 0 | 0 | SM2 SM3 SP1 SP2 SK3 | SM0 SM1 SM4 SP0 SP3 SP4 SK0 SK1 SK2 | 36(VREF/64) |
| 1 | 0 | 0 | 1 | 0 | 1 | SM2 SM3 SP1 SP2 SK2 | SM0 SM1 SM4 SP0 SP3 SP4 SK0 SK1 SK3 | 37(VREF/64) |
| 1 | 0 | 0 | 1 | 1 | 0 | SM2 SM3 SP1 SP2 SK1 | SM0 SM1 SM4 SP0 SP3 SP4 SK0 SK2 SK3 | 38(VREF/64) |
| 1 | 0 | 0 | 1 | 1 | 1 | SM2 SM3 SP1 SP2 SK0 | SM0 SM1 SM4 SP0 SP3 SP4 SK2 SK3 SK4 | 39(VREF/64) |
| 1 | 0 | 1 | 0 | 0 | 0 | SM2 SM3 SP2 SP3 SK0 | SM0 SM1 SM4 SP0 SP1 SP4 SK1 SK2 SK3 | 40(VREF/64) |
| 1 | 0 | 1 | 0 | 0 | 1 | SM2 SM3 SP2 SP3 SK1 | SM0 SM1 SM4 SP0 SP1 SP4 SK0 SK2 SK3 | 41(VREF/64) |
| 1 | 0 | 1 | 0 | 1 | 0 | SM2 SM3 SP2 SP3 SK2 | SM0 SM1 SM4 SP0 SP1 SP4 SK0 SK1 SK3 | 42(VREF/64) |
| 1 | 0 | 1 | 0 | 1 | 1 | SM2 SM3 SP2 SP3 SK3 | SM0 SM1 SM4 SP0 SP1 SP4 SK0 SK1 SK2 | 43(VREF/64) |
| 1 | 0 | 1 | 1 | 0 | 0 | SM2 SM3 SP3 SP4 SK3 | SM0 SM1 SM4 SP0 SP1 SP2 SK0 SK1 SK2 | 44(VREF/64) |
| 1 | 0 | 1 | 1 | 0 | 1 | SM2 SM3 SP3 SP4 SK2 | SM0 SM1 SM4 SP0 SP1 SP2 SK0 SK1 SK3 | 45(VREF/64) |
| 1 | 0 | 1 | 1 | 1 | 0 | SM2 SM3 SP3 SP4 SK1 | SM0 SM1 SM4 SP0 SP1 SP2 SK0 SK2 SK3 | 46(VREF/64) |
| 1 | 0 | 1 | 1 | 1 | 1 | SM2 SM3 SP3 SP4 SK0 | SM0 SM1 SM4 SP0 SP1 SP2 SK1 SK2 SK3 | 47(VREF/64) |
| 1 | 1 | 0 | 0 | 0 | 0 | SM3 SM4 SP3 SP4 SK0 | SM0 SM1 SM2 SP0 SP1 SP2 SK1 SK2 SK3 | 48(VREF/64) |
| 1 | 1 | 0 | 0 | 0 | 1 | SM3 SM4 SP3 SP4 SK1 | SM0 SM1 SM2 SP0 SP1 SP2 SK0 SK2 SK3 | 49(VREF/64) |
| 1 | 1 | 0 | 0 | 1 | 0 | SM3 SM4 SP3 SP4 SK2 | SM0 SM1 SM2 SP0 SP1 SP2 SK0 SK1 SK3 | 50(VREF/64) |
| 1 | 1 | 0 | 0 | 1 | 1 | SM3 SM4 SP3 SP4 SK3 | SM0 SM1 SM2 SP0 SP1 SP2 SK0 SK1 SK2 | 51(VREF/64) |
| 1 | 1 | 0 | 1 | 0 | 0 | SM3 SM4 SP2 SP3 SK3 | SM0 SM1 SM2 SP0 SP1 SP4 SK0 SK1 SK2 | 52(VREF/64) |
| 1 | 1 | 0 | 1 | 0 | 1 | SM3 SM4 SP2 SP3 SK2 | SM0 SM1 SM2 SP0 SP1 SP4 SK0 SK1 SK3 | 53(VREF/64) |
| 1 | 1 | 0 | 1 | 1 | 0 | SM3 SM4 SP2 SP3 SK1 | SM0 SM1 SM2 SP0 SP1 SP4 SK0 SK2 SK3 | 54(VREF/64) |
| 1 | 1 | 0 | 1 | 1 | 1 | SM3 SM4 SP2 SP3 SK0 | SM0 SM1 SM2 SP0 SP1 SP4 SK2 SK3 SK4 | 55(VREF/64) |
| 1 | 1 | 1 | 0 | 0 | 0 | SM3 SM4 SP1 SP2 SK0 | SM0 SM1 SM2 SP0 SP3 SP4 SK1 SK2 SK3 | 56(VREF/64) |
| 1 | 1 | 1 | 0 | 0 | 1 | SM3 SM4 SP1 SP2 SK1 | SM0 SM1 SM2 SP0 SP3 SP4 SK0 SK2 SK3 | 57(VREF/64) |
| 1 | 1 | 1 | 0 | 1 | 0 | SM3 SM4 SP1 SP2 SK2 | SM0 SM1 SM2 SP0 SP3 SP4 SK0 SK1 SK3 | 58(VREF/64) |
| 1 | 1 | 1 | 0 | 1 | 1 | SM3 SM4 SP1 SP2 SK3 | SM0 SM1 SM2 SP0 SP3 SP4 SK0 SK1 SK2 | 59(VREF/64) |
| 1 | 1 | 1 | 1 | 0 | 0 | SM3 SM4 SP0 SP1 SK3 | SM0 SM1 SM2 SP2 SP3 SP4 SK0 SK1 SK2 | 60(VREF/64) |
| 1 | 1 | 1 | 1 | 0 | 1 | SM3 SM4 SP0 SP1 SK2 | SM0 SM1 SM2 SP2 SP3 SP4 SK0 SK1 SK3 | 61(VREF/64) |
| 1 | 1 | 1 | 1 | 1 | 0 | SM3 SM4 SP0 SP1 SK1 | SM0 SM1 SM2 SP2 SP3 SP4 SK0 SK2 SK3 | 62(VREF/64) |
| 1 | 1 | 1 | 1 | 1 | 1 | SM3 SM4 SP0 SP1 SK0 | SM0 SM1 SM2 SP2 SP3 SP4 SK1 SK2 SK3 | 63(VREF/64) |

FIG. 3

TRIPLE RESISTOR STRING DAC ARCHITECTURE

FIELD OF THE INVENTION

The present invention relates to data conversion systems, in particular, to a resistor string type digital-to-analog converter (DAC) adapted for integrated circuit fabrication.

BACKGROUND OF THE INVENTION

As is known in the art, DACs are used widely in variety of applications to convert an N-bit digital word to a corresponding analog signal, typically a voltage signal. Currently, there are a number of DAC architectures based on different conversion techniques to convert the N-bit digital word to a corresponding voltage signal. Voltage-scaling DACs, current-scaling DACs, charge-scaling DACs, and a combination of voltage and current scaling DACs are just a few examples of current conversion techniques used in the DAC architectures.

The current-scaling DACs can be power hungry due to the requirement of an additional current-to-voltage conversion element Such current-scaling DACs are generally not suitable for applications requiring low power and small chip area The charge-scaling DACs generally have a leakage and hence can require a frequent charge refresh. Therefore, such charge-scaling DACs are generally not suitable for applications where there is no free running clock to refresh the charge. Moreover, a free running clock can introduce undesirable noise in the output.

Whereas, the voltage-scaling DACs have high accuracy, high speed, monotonocity, and low power requirement and therefore are generally widely used. A typical N-bit voltage scaling DAC comprises of a single resistor string of (2\*\*N) resistors of value R and a switching network to couple the voltage at one of the resistors to an output to produce the converted voltage. While such DAC architecture is suitable for applications where N is relatively small, when N is large, the number of resistors and switches required increases exponentially and hence can significantly increase the required chip area, thus making it not suitable for applications requiring small chip area.

One technique suggested to reduce the number of elements in a single resistor string converter is to use a segmented dual string converter. In the segmented dual string, a first stage uses a resistor string for converting a group of higher order bits in the N-bit digital word and a second stage decodes the remaining lower order bits. A non-linear converter of this type is shown in an article by Gryzbowski et al., entitled "Non-linear Functions from D/A converters", Electronic Engineering 1971, pgs. 48–51. The converter presented in this article is designed for operation with relay switching and is not readily adaptable to modem semiconductor technology.

While the current segmented dual string techniques are useful in many applications. They still require relatively higher number of resistors and switches in the first and second stages thereby requiring a relatively large chip surface area during fabrication. In addition, the capacitance also increases due to the higher number of switches. Increased capacitance can result in lower speed and performance. For example, a 16-bit resolution DAC having 8 bits in the primary string and 8 bits in the secondary string requires 513 switches and 511 resistors (i.e., $(2^9+1)$ resistors and $(2^9-1)$ switches). Further, to go to a higher resolution, for example, going from a 16-bit resolution to a 20 bit resolution, the number of switches required for every bit increases by a factor of $2^{1/2}$. Therefore, going from the 16-bit resolution to the 20-bit resolution increases the number of required switches by a factor of 4, i.e., the number of required switches increases from 513 switches to 2049 switches. This can result in an extendibility problem. In addition, in all types of segmented resistor string DACs, the on-resistance of the switches used in the switching network plays an important role in determining the differential non linearity (DNL) of the segmented resistor string DACs. In general, the higher the on-resistance, the higher will be the DNL of the segmented resistor string DACs. Therefore, increasing the resolution can not only increase required chip area but can also increase time constant, i.e., resistance and capacitance in a signal path, which in-turn can result in lower speed and performance.

SUMMARY OF THE INVENTION

An N-bit voltage scaling digital-to-analog converter for converting an N-bit digital word to a range of corresponding analog voltage signals. In one example embodiment, a triple segmented converter is used to convert the N-bit digital word to corresponding analog voltage signals. In the triple segmented converter, a first stage uses a resistor string and an associated switching network that converts a group of higher order bits in the N-bit digital word. Second and third stages include resistor strings and associated switching networks that are coupled to the first stage. The second and third stages convert remaining lower order bits in the N-bit digital word and outputs a range of corresponding analog voltage signals as function of the converted higher and lower order bits in the N-bit digital word when the first resistor string is connected across a voltage supply.

BRIEF DESCRIPTION OF THE DRAWINGS

FIG. 3 is a table showing relationship between 6-bit digital words fed to the DAC of FIG. 2 and resulting open/closed positions of switches and outputted voltage in the DAC.

DETAILED DESCRIPTION OF THE INVENTION

The present invention provides higher resolution DAC architecture without increasing chip area. In addition, the present invention converts an N-bit digital word to a corresponding analog voltage signal without increasing switching network capacitance. In one embodiment, a triple string converter including triple resistor strings and associated switching networks are used to convert the N-bit digital word to an analog voltage signal.

In the following detailed description of the embodiments of the invention, reference is made to the accompanying drawings that form a part hereof, and in which are shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention.

The following detailed description is, therefore not to be taken in a limiting sense, and the scope of the present invention is defined only by the appended claims.

The terms "first string" and "primary string" are used interchangeably throughout the document. Also, the terms "second string" and "secondary string" are used interchangeably throughout the document. Further, the terms "third string" and "tertiary string" are used interchangeably throughout the document. Similarly, the terms "first control signal" and "first logic signal", "second control signal" and "second logic signal", and "third control signal" and "third logic signal" are used interchangeably throughout the document. Furthermore, the terms "triple switching tree", "cascaded coarse and fine resistor divider strings", and "triple string converter" are used interchangeably throughout the document.

Figure 1:
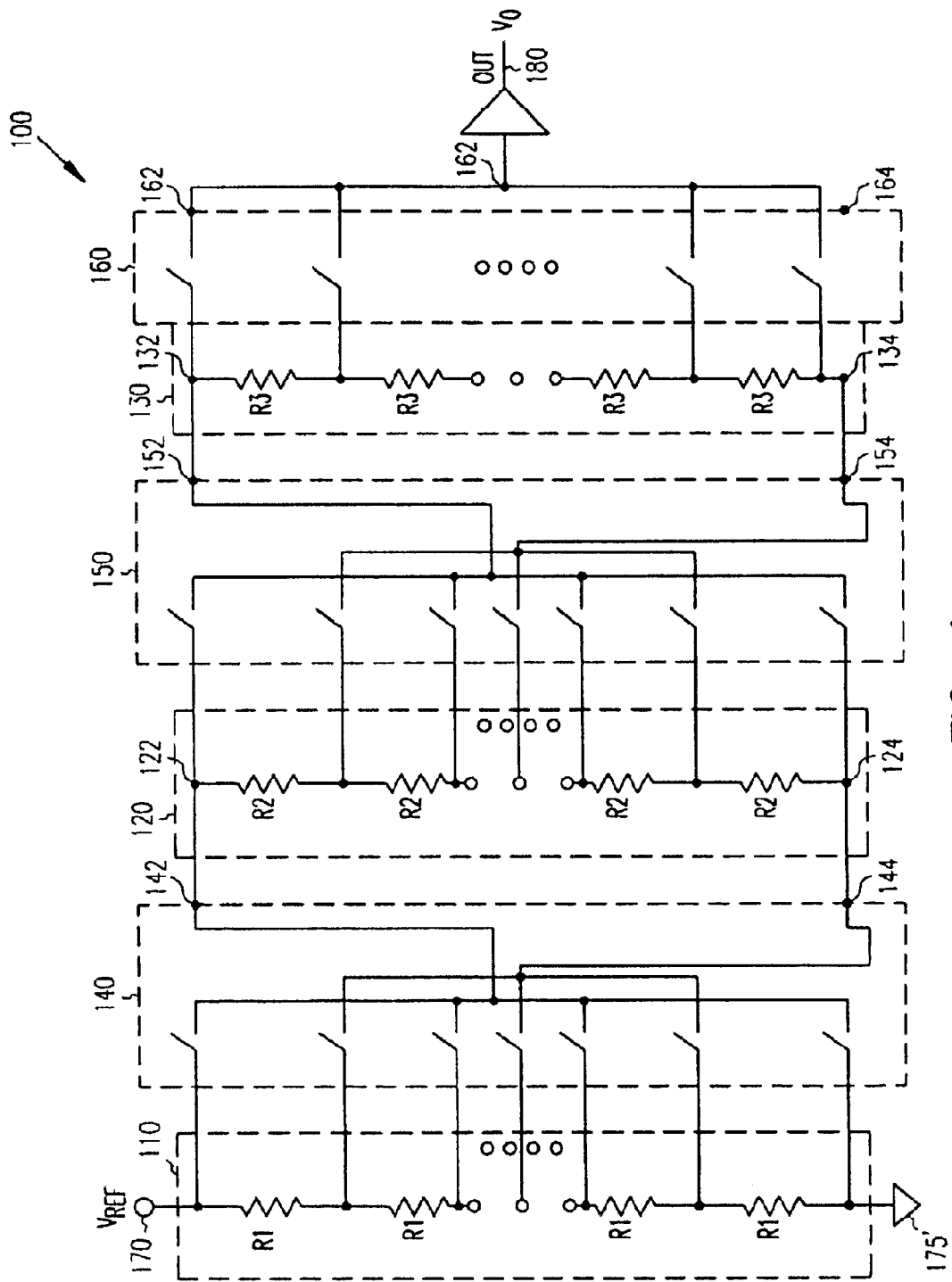
FIG. 1 illustrates a solution according to one embodiment of the present subject matter, in circuit form, an N-bit triple string digital-to-analog converter architecture.

Referring now to FIG. 1, there is illustrated an example embodiment of a circuit diagram 100 of an N-bit DAC according to the present invention. The circuit 100 shown in FIG. 1 includes a triple resistor string including a first, second, and third resistor strings 110, 120, and 130, respectively. The first resistor string 110 is adapted for coupling across a voltage supply. The voltage supply produces a voltage, $V_{REF}$ at terminal 170 relative to ground potential at terminal 175.

As shown in FIG. 1, the first resistor string 110 has a plurality of, here $2^M$, (i.e., M being number of most significant bits (MSBs) in an N-bit digital word) resistors, serially connected between the terminals 170 and 175. The resistance of each resistor in the first string 110 is substantially equal to $R_1$ ohms. The resistors in the first resistor string 110 produce voltages across their associated terminals in response to current fed thereto from the voltage supply.

The second resistor string 120 has a plurality of, here $2^P$, (i.e., P being a number of higher order least significant bits (LSBs) in the N-bit digital word) resistors, serially connected between input terminals 122 and 124. The resistance of each resistor in the second string 120 is substantially equal to $R_2$ ohms. The third resistor string 130 also has a plurality of, here $2^K-1$, (i.e., K being a number of lower order LSBs in the N-bit digital word) resistors, serially connected between input terminals 132 and 134. The resistance of each resistor in the third string 130 is substantially equal to $R_3$ ohms. The number of resistors in each of the first, second, and third resistor strings 110, 120, and 130 are computed, to obtain the N-bit resolution, using the following equation:

N-bit digital word=MMSBs+P higher order LSBs+K lower order LSBs.

Using the above equation, results in subdividing the reference voltage $V_{REF}$ into M MSBs by the $2^M$ resistors in the first string 110. The voltage obtained across a single resistor in the first string 110 is further subdivided, i.e., an MSB is subdivided into P higher order LSBs by the $2^P$ resistors in the second string 120. The voltage divided in the second string 120 is further subdivided into K lower order LSBs by the $2^K-1$ resistors in the third string to obtain the N-bit resolution. The total number of resistors required to obtain the N-bit resolution in the triple string DAC architecture shown in FIG. 1 is $(2^M+2^P+2^K-1)$.

A first switching network 140 has a pair of switch output terminals 142 and 144 connected to the second resistor string 120 input terminals 122 and 124, respectively, as shown. The first switching network 140 includes a plurality of, here $(2^M+1)$, switches. Inputs of each switch in the first switching network 140 are connected to terminals of each associated resistor in the first resistor string 110 as shown in FIG. 1. Outputs of each switch in the first switching network 140 are connected to the output terminals 142 and 144 as shown in FIG. 1. The on/off conditions of the switches in the first switching network 140 are controlled by a first logic signal. The first logic signal is generated as a function of the MSBs in the N-bit digital word.

A second switching network 150 has a pair of switch output terminals 152 and 154 connected to the third resistor string 130 input terminals 132 and 134, respectively, as shown. The second switching network 150 includes a plurality of, here $(2^P+1)$, switches. Inputs of each switch in the second switching network 150 are connected to terminals of each associated resistor in the second resistor string 120 as shown in FIG. 1. Outputs of each switch in the second switching network 150 are connected to the output terminals 152 and 154 as shown in FIG. 1. The on/off conditions of the switches in the second switching network 150 are controlled by a second logic signal. The second logic signal is generated as a function of the P higher order LSBs in the N-bit digital word.

A third switching network 160 has a pair of switch output terminals 162 and 164 connected to a common output at terminal 162, which provides an output voltage $V_o$, i.e., the converted analog signal at 180. The third switching network 160 includes a plurality of, here ($2^K$), switches. Inputs of each switch in the third switching network 160 are connected to terminals of each associated resistor in the third resistor string 130 as shown in FIG. 1. Outputs of each switch in the third switching network 160 are connected to the output terminals 162 and 164 as shown in FIG. 1. The on/off conditions of the switches in the third switching network 160 are controlled by a third logic signal. The third logic signal is generated as a function of the K lower order LSBs in the N-bit digital word. The number of switches required to obtain the N-bit resolution in the triple string DAC architecture shown in FIG. 1 is equal to $((2^M+1)+(2^P+1)+(2^K))$.

Figure 2:
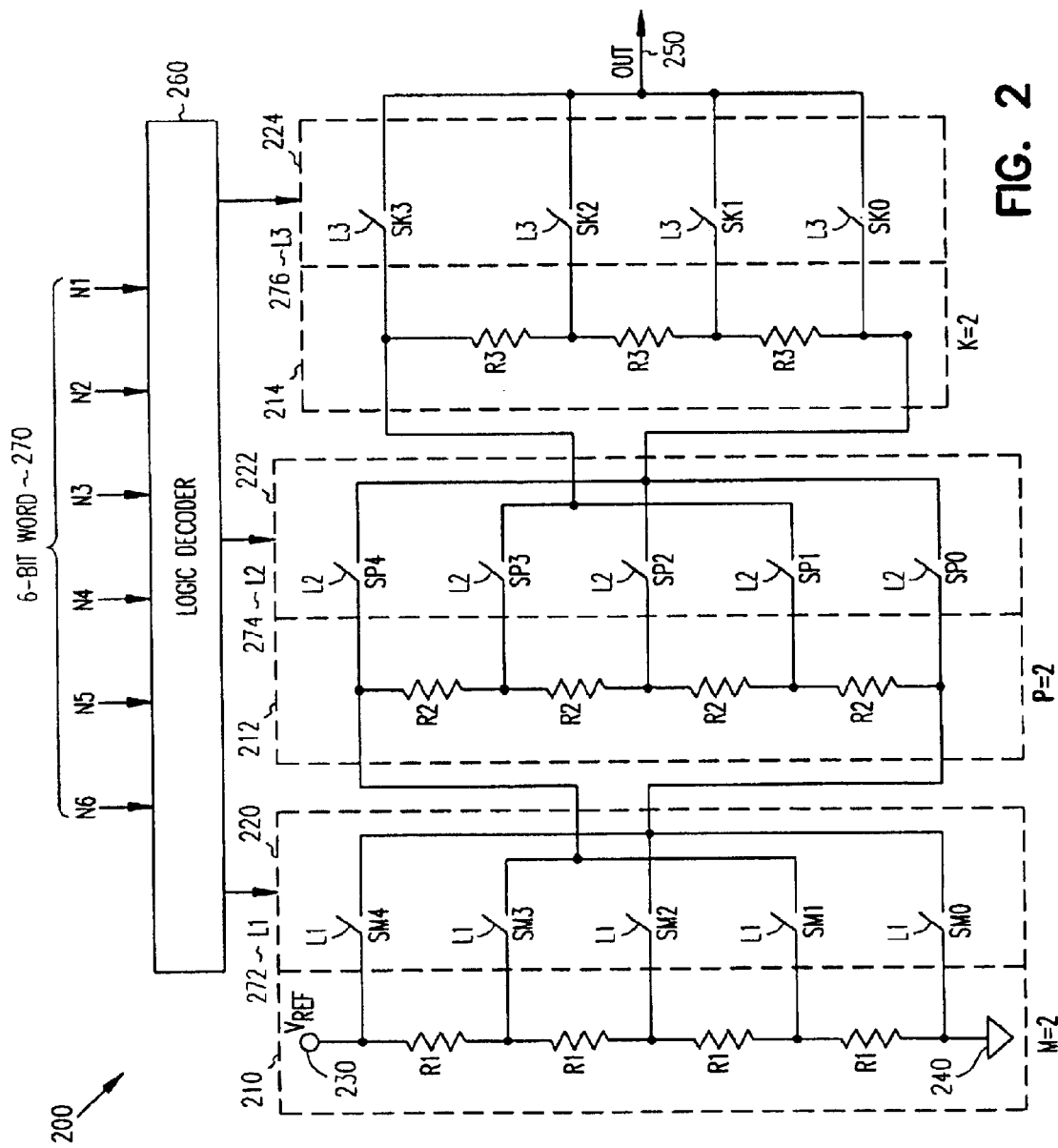
FIG. 2 illustrates a solution according to one embodiment of the present subject matter, in circuit form, a 6-bit triple string digital-to-analog converter (DAC) architecture.

Referring now to FIG. 2, there is illustrated an example embodiment of a circuit diagram 200 of a 6-bit triple string DAC according to the present invention. The principle operation of the circuit 100, of the N-bit triple string DAC, shown in FIG. 1 is illustrated using the simplified circuit 200 of the 6-bit triple string DAC shown in FIG. 2. As shown in FIG. 2, the circuit 200 includes first, second, and third resistor strings 210, 212, and 214 which are coupled similarly to corresponding first, second, and third switching networks 220, 222, and 224 as shown in FIG. 1. The first, second, and third switching networks 220, 222, and 224 have 5 switches SM0–SM4, 5 switches SP0–SP4, and 4 switches SK0–SK3, respectively. In addition to what is shown in FIG. 1, FIG.2 illustrates a logic decoder 260 coupled to the first, second, and third switching networks 220, 222, and 224 via the control lines L1, L2, and L3, respectively.

It should be noted that an N-bit resolution DAC employing the dual string approach requires $(2^M+2^P+1)$ number of switches and $(2^M+2^P-1)$ resistors each. Wherein M is number of bits in a primary string and P is a number of bits in a secondary string. For example, a 16-bit resolution dual string DAC, using the equation, N-bit digital word=$M$ MSBs+$P$ LSBs, will result in N being 16 and P and M each being 8. This in turn results in requiring $(2^9+1)$ number of switches and $(2^9-1)$ number of resistors each, which is 513 switches and 511 resistors. Whereas, a 16-bit resolution triple string DAC, using the above-described equation, with reference to FIG. 1, i.e., N-bit digital word=M MSBs+P higher order LSBs+k lower order LSBs, will result in N being 16, M being 6, P being 6, and K being 4. Using this equation will result in requiring ($2^6+2^6+2^4+2$) number of switches and ($2^6+2^6+2-1$) number of resistors, which is 146 switches and 143 resistors. This is a substantial reduction from the 513 switches and 511 resistors required in a 16-bit resolution dual string DAC. Even if the resolution is increased from 16-bit to a 20-bit, the number of switches and resistors required will only increase from 146 to 322 in a triple string DAC. This increase in number of required switches is only about 2.2 times for a triple string DAC when compared with the increase of 4 times for a dual string DAC.

Therefore, the triple string DAC architecture, shown in FIGS. 1 and 2, offers a significant advantage in terms of extendibility without increasing chip area over the dual string DAC. In addition, a reduction in the number of switches results in lowering the cumulative switch capacitance and hence an improved speed and performance. Generally, switch resistance affects DNL of a DAC. Therefore, the impact of such switch resistance on a differential non linearity (DNL) needs to be considered when designing circuitry for a DAC. Zero LSB DNL can be achieved in the triple string DAC architecture using the following equations:

$$R_2=2^{K}*(R_1+2*R_{ON12TYP})$$

$$R_3=R_2+2*R_{ON23TYP}$$

Wherein $R_1$, $R_2$, and $R_3$ are the resistance values of the first, second, third resistor strings 210, 212, and 214, K is the number of lower order LSBs used to control the third switching network 224, $R_{ON12TYP}$ is a typical switch resistance between first and second resistor strings, and $R_{ON23TYP}$ is a typical switch resistance between second and third resistor strings.

A higher accuracy DAC requires the DNL to be in the range of +1 LSB and −1 LSB. Taking into consideration a varying switch resistance, maximum switch resistances to have DNL in the range of about +1 LSB to −1 LSB can be as follows:

$$R_{ON12MAX}=R_{ON12TYP}+R_2/2^{K+1}=R_2/2^K-R_1/2$$

$$R_{ON23MAX}=R_{ON23TYP}+R_3/2=R_3-R_2/2$$

In operation, consider as an example condition, as shown in the circuit diagram 200 in FIG. 2 and table 300 in FIG. 3, where a higher order LSB transition occurs keeping MSBs constant, i.e., transition in the second switching network 222 occurs while switch conditions in the first and third switching networks 220 and 224 are constant. Here the digital word, N6, N5, N4, N3, N2, N1 is changing from 000011 (i.e., the bits N6–N3 are at logic '0' and the bits N2–N1 are at logic '1') to 000100 (i.e., the bits N6–N4 and N2–N1 are set to logic '0' and the bit N3 is set to logic '1'). The corresponding change in switch configuration is as shown in table 300, i.e. switch SP0 will open and switch SP2 will close. This change in switch configuration causes the output voltage at 250 to change from 3($V_{REF}$/64) volts to 4($V_{REF}$/64) volts. Consider another example condition, as shown in circuit diagram 200 in FIG. 2 and table 300 in FIG. 3, where an MSB transition occurs, i.e., transition in the first switching network 220 occurs while switch conditions in the second and third switching networks 222 and 224 are constant. Here the digital word, N6, NS, N4, N3, N2, N1 changes from 001111 (i.e., the bits N6–N5 are at logic '0' and the bits N4–N1 are at logic '1') to 010000 (i.e., the bits N6 and N4–N1 are set to logic '0' and the bit is set to N5 is logic '0'). The corresponding change in switch configuration is as shown in table 300, i.e. switch SM0 will open and switch SM2 will close. This change in switch configuration causes the output voltage at 250 to change from 15($V_{REF}$/64) volts to 16($V_{REF}$/64) volts.

Conclusion

The above-described invention provides higher resolution DAC architecture. In addition, the above-described DAC architecture converts an N-bit digital word into corresponding analog voltage signal without increasing chip area and switching network capacitance. Further, the architecture increases resolution without compromising the speed. This is achieved by using cascaded coarse and fine triple resistor string architecture.

The various embodiments of the DAC architecture described herein are applicable generally to any digital-to-analog converters, and the embodiments described herein are in no way meant to limit the applicability of the invention. Further, various technologies may be used for the switches, such as CMOS transmission gates and NMOS and PMOS transistors. The on-resistance of the switches in the first, second, and third plurality of switching networks being a fraction of a unit resistance value of the first, second, and third resistor strings. Furthermore, the switches can be of varying sizes. In addition, the techniques of the various example embodiments are useful to the design of any hardware implementations of software, firmware, and algorithms. The above description is intended to be illustrative, and not restrictive. Many other embodiments will be apparent to those skilled in the art. The scope of the invention should therefore be determined by the appended claims, along with the full scope of equivalents to which such claims are entitled.

What is claimed is:

1. A digital-to-analog converter, comprising:
  a triple switching tree switchably coupled to a triple resistor string and to an analog output,
  wherein the triple resistor string includes a first resistor string having a first plurality of resistors for coupling across the voltage supply, a second resistor string having a second plurality of resistors, and a third resistor string having a third plurality of resistors, and
  wherein the triple switching tree comprises a first switching network comprising a first mirror-imaged plurality of switches, wherein each of the first mirror-imaged plurality of switches having an input connected to one of the first plurality of resistors and an output to couple across the second resistor string;
  a second switching network comprising a second mirror-imaged plurality of switches, wherein each of the second mirror-imaged plurality of switches having an input connected to one of the second plurality of resistors and an output to couple across the third resistor string; and
  a third switching network comprising a third mirror-imaged plurality of switches, wherein each of the mirror-imaged plurality of switches having an input connect to one of the third plurality of resistors and an output to connect to the analog output,
  wherein the plurality of switches in each branch is substantially simultaneously controlled by an N-bit digital word to output a range of corresponding analog voltage signals, and wherein the triple switching tree is operable when the triple resistor string is coupled across a voltage supply.

2. The digital-to-analog converter of claim 1, wherein the first switching network is controlled by most significant bits (MSBs) and the second and third switching networks are controlled by higher order and lower order least significant bits (LSBs) in the N-bit digital word, respectively.

3. The digital-to-analog converter of claim 1, wherein the switches in the first, second, and third plurality of switching networks are selected from the group consisting of CMOS transmission gates, NMOS transistors, and PMOS transistors.

4. A digital-to-analog converter circuit, comprising:
   a first resistor string having a first plurality of resistors to couple across a voltage supply;
   a second resistor string having a second plurality of resistors;
   a third resistor string having a third plurality of resistors;
   a first switching network comprising a first mirror-imaged plurality of switches, wherein each of the first mirror-imaged plurality of switches having an input connected to one of the first plurality of resistors and an output to couple across the second resistor string;
   a second switching network comprising a second mirror-imaged plurality of switches, wherein each of the second mirror-imaged plurality of switches having an input connected to one of the second plurality of resistors and an output to couple across the third resistor string; and
   a third switching network comprising a third mirror-imaged plurality of switches, wherein each of the mirror-imaged plurality of switches having an input connect to one of the third plurality of resistors and an output to connect to a common output.

5. The circuit of claim 4, further comprising:
   a logic decoder to couple to the first, second, and third switching networks, wherein the logic decoder to receive a digital input and to output first, second, and third sets of logic signals, and wherein the first, second, and third switching networks to receive the first, second, and third sets of logic signals and select one of the first, second, and third plurality of resistors via the first, second, and third mirror-imaged plurality of switches coupled to the associated first, second, and third plurality of resistors, respectively.

6. The circuit of claim 5, wherein the digital input comprises an N-bit digital word, wherein the N-bit digital word comprises MSBs, higher order LSBs, and lower order LSBs, wherein the logic decoder produces the first, second, and third sets of logic signals as a function of the received MSBs, higher order LSBs, and lower order LSBs.

7. The circuit of claim 4, wherein the switches in the first, second, and third plurality of switching networks are selected from the group consisting of CMOS transmission gates, NMOS transistors, and PMOS transistors.

8. The circuit of claim 7, wherein the switches in the first, second, and third plurality of switching networks are of varying sizes.

9. The circuit of claim 7, wherein the switches in the first, second, and third plurality of switching networks have an on-resistance of about a fraction of a unit resistance value of the first, second, and third resistor strings.

10. A digital-to-analog converter for converting a digital word into a corresponding analog signal, comprising:

a first resistor string having a first plurality of resistors to couple across a voltage supply;
a second resistor string having a pair of terminals, wherein the second resistor string includes a second plurality of resistors;
a third resistor string having a pair of terminals, wherein the third resistor string includes a third plurality of resistors;
a first switching network comprising a first mirror-imaged plurality of switches to couple to a voltage produced across a selected one of the first plurality of resistors via the first mirror-imaged plurality of switches coupled to the associated first plurality of resistors, wherein the first switching network is coupled to the pair of terminals in the second resistor string, wherein the second plurality of resistors produces voltages in response to a current passing via the first resistor string to the second resistor string via the first switching network;
a second switching network comprising a second mirror-imaged plurality of switches to couple to a voltage produced across a selected one of the second plurality of resistors via the second mirror-imaged plurality of switches coupled to the associated second plurality of resistors, wherein the second switching network is coupled to the pair of terminals in the third resistor string, wherein the third plurality of resistors produces voltages in response to a current passing via the second resistor string to the third resistor string via the second switching network; and
a third switching network comprising a third mirror-imaged plurality of switches, wherein each of the third mirror-imaged plurality of switches having an input connected to one of the third plurality of resistors and an output to connect to a common output, wherein the third switching network to couple to one of the voltages produced by a selected one of the third plurality of resistors to the common output.

11. The digital-to-analog converter of claim 10, wherein the switches in the first, second, third plurality of switching networks are selected from the group consisting of CMOS transmission gates, NMOS transistors, and PMOS transistors.

12. The digital-to-analog converter of claim 10, wherein the first plurality of resistors comprises:
   $2^M$ resistors in the first resistor string, wherein M being a number of MSBs in an N-bit digital word.

13. The digital-to-analog converter of claim 12, wherein the second plurality of resistors comprises:
   $2^P$ resistors in the second resistor string, wherein P being a number of higher order LSBs in an N-bit digital word.

14. The digital-to-analog converter of claim 13, wherein the third plurality of resistors comprises:
   $2^K-1$ resistors in the third resistor string, wherein K being a number of lower order LSBs in an N-bit digital word.

15. The digital-to-analog converter of claim 14, wherein the N-bit digital word comprises:
   N-bit digital word=M MSBs +P higher order LSBs+K lower order LSBs.

16. A digital-to-analog converter with cascaded coarse and fine resistor divider strings, comprising:
   a primary resistor string having a first plurality of resistors to couple across a voltage supply;
   a secondary resistor string having a pair of terminals, wherein the secondary resistor string includes a second plurality of resistors;

a tertiary resistor string having a pair of terminals, wherein the tertiary resistor string includes a third plurality of resistors;

a primary switching network comprising a plurality of switches to couple to a voltage produced across a selected one of the first plurality of resistors in response to a first set of logic signals via the first plurality of switches coupled to the associated first plurality of resistors, wherein the primary switching network is coupled to the pair of terminals in the secondary resistor string, wherein the second plurality of resistors produces voltages in response to a current passing via the primary resistor string to the secondary resistor string via the primary switching network;

a secondary switching network comprising a plurality of switches to couple to a voltage produced across a selected one of the second plurality of resistors in response to a second set of logic signals via the second plurality of switches coupled to the associated second plurality of resistors, wherein the secondary switching network is coupled to the pair of terminals in the tertiary resistor string, wherein the third plurality of resistors produces voltages in response to a current passing via the secondary resistor string to the tertiary resistor string via the secondary switching network; and a tertiary switching network comprising a plurality of switches, wherein each of the third plurality of switches having an input connected to one of the third plurality of resistors and an output to connect to a common output, wherein the tertiary switching network to couple to one of the voltages produced by a selected one of the tertiary plurality of resistors to the common output in response to a third set of logic signals.

17. The digital-to-analog converter of claim 16 further comprising:

a logic decoder to couple to the primary, secondary, and tertiary switching networks, wherein the logic decoder receives a digital input and outputs the first, second and third sets of logic signals.

18. The digital-to-analog converter of claim 17, wherein the digital input comprises an N-bit digital word, wherein the N-bit digital word comprises an M number of MSBs, a P number of higher order LSBs, and a K number of lower order LSBs, wherein the logic decoder produces the first, second, and third sets of logic signals as a function of the received M number of MSBs, P number of higher order LSBs, and K number of lower order LSBs.

19. An integrated circuit, comprising:

a first resistor string having a first plurality of resistors to couple across a voltage supply;

a second resistor string having a second plurality of resistors;

a third resistor string having a third plurality of resistors;

a first switching network comprising a first mirror-imaged plurality of switches, wherein each of the first mirror-imaged plurality of switches having an input connected to one of the first plurality of resistors and an output to couple across the second resistor string;

a second switching network comprising a second mirror-imaged plurality of switches, wherein each of the second mirror-imaged plurality of switches having an input connected to one of the second plurality of resistors and an output to couple across the third resistor string;

a third switching network comprising a third mirror-imaged plurality of switches, wherein each of the mirror-imaged plurality of switches having an input connect to one of the third plurality of resistors and an output to connect to a common output; and a logic decoder to couple to the first, second, and third switching networks, wherein the logic decoder receives a digital input and outputs first, second, and third sets of logic signals as a function of the digital input, and wherein the first, second, and third switching networks receive the first, second, and third sets of logic signals and selects one of the first, second, and third plurality of resistors via the first, second, and third mirror-imaged plurality of switches coupled to the associated first, second, and third plurality of resistors, respectively.

20. The circuit of claim 19, wherein the switches in the first, second, and third plurality of switching networks are selected from the group consisting of CMOS transmission gates, NMOS transistors, and PMOS transistors.

21. The circuit of claim 19, wherein the switches in the first, second, and third plurality of switching networks are of varying sizes.

22. The circuit of claim 19, wherein the switches in the first, second, and third plurality of switching networks have an on-resistance of about a fraction of a nominal resistance value of the first, second, and third resistor strings.

* * * * *